(12) United States Patent
Apodaca et al.

(10) Patent No.: US 9,929,214 B2
(45) Date of Patent: Mar. 27, 2018

(54) NANO-IMPRINTED SELF-ALIGNED MULTI-LEVEL PROCESSING METHOD

(71) Applicant: Western Digital Technologies, Inc., San Jose, CA (US)

(72) Inventors: Mac D. Apodaca, San Jose, CA (US); Daniel Robert Shepard, North Hampton, NH (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 15/477,739

(22) Filed: Apr. 3, 2017

(65) Prior Publication Data
US 2017/0301677 A1   Oct. 19, 2017

Related U.S. Application Data

(62) Division of application No. 15/098,253, filed on Apr. 13, 2016.

(51) Int. Cl.
*H01L 47/00* (2006.01)
*H01L 27/24* (2006.01)
(Continued)

(52) U.S. Cl.
CPC ...... *H01L 27/249* (2013.01); *H01L 27/10823* (2013.01); *H01L 27/10864* (2013.01);
(Continued)

(58) Field of Classification Search
CPC ............ H01L 21/8229; H01L 21/8239; H01L 27/1023; H01L 27/1025
See application file for complete search history.

(56) References Cited

U.S. PATENT DOCUMENTS 7,297,598 B2   11/2007   Liu et al.
7,795,149 B2   9/2010    Sandhu
(Continued)

FOREIGN PATENT DOCUMENTS

WO   2013/029564 A1   3/2013

OTHER PUBLICATIONS

Xia, et al.; NANO Letters; Self-Aligned Memristor Cross-Point Arrays Fabricated with One Nanoimprint Lithography Step; dated Jun. 30, 2010; 2 total pages.

*Primary Examiner* — Elias M Ullah
(74) *Attorney, Agent, or Firm* — Patterson + Sheridan, LLP; Steven H. VerSteeg

(57) ABSTRACT

The present disclosure generally relates to fine geometry electrical circuits and methods of manufacture thereof. More specifically, methods for forming 3D cross-point memory arrays using a single nano-imprint lithography step and no photolithography are disclosed. The method includes imprinting a multilevel topography pattern, transferring the multilevel topography pattern to a substrate, filling the etched multilevel topography pattern with hard mask material, planarizing the hard mask material to expose a first portion of the substrate, etching a first trench in the first portion of the substrate, depositing a first plurality of layers in the first trench, planarizing the hard mask material to expose a second portion of the substrate, etching a second trench in the second portion of the substrate and depositing a second plurality of layers in the second trench. The method is repeated until a $4F^2$ 3D cross-point memory array has been formed.

22 Claims, 16 Drawing Sheets

(51) Int. Cl.
  *H01L 45/00* (2006.01)
  *H01L 27/108* (2006.01)
  *H01L 27/112* (2006.01)
  *H01L 27/11521* (2017.01)
  *H01L 27/11551* (2017.01)
  *H01L 29/10* (2006.01)

(52) U.S. Cl.
  CPC ...... *H01L 27/10876* (2013.01); *H01L 27/112* (2013.01); *H01L 27/11521* (2013.01); *H01L 27/11551* (2013.01); *H01L 27/2427* (2013.01); *H01L 29/1037* (2013.01); *H01L 45/085* (2013.01); *H01L 45/1233* (2013.01); *H01L 45/1266* (2013.01); *H01L 45/1683* (2013.01)

(56) References Cited

U.S. PATENT DOCUMENTS

| | | |
|---|---|---|
| 7,888,210 B2 | 2/2011 | Purayath et al. |
| 8,233,317 B2 | 7/2012 | Breitwisch et al. |
| 8,586,962 B2 | 11/2013 | Lee et al. |
| 8,946,022 B2 | 2/2015 | Purayath et al. |
| 2008/0286449 A1 | 11/2008 | Park |
| 2009/0032856 A1* | 2/2009 | Chen .................. H01L 27/105 257/302 |

\* cited by examiner

NANO-IMPRINTED SELF-ALIGNED MULTI-LEVEL PROCESSING METHOD

CROSS-REFERENCE TO RELATED APPLICATIONS

This application is a divisional application of co-pending U.S. patent application Ser. No. 15/098,253, filed on Apr. 13, 2016, which herein is incorporated by reference.

BACKGROUND OF THE DISCLOSURE

Field of the Disclosure

Embodiments of the present disclosure generally relate to data storage and computer memory systems, and more particularly to methods of fabricating fine geometry electrical circuits, such as 3D cross-point memory arrays.

Description of the Related Art

Semiconductor manufacturing of memory devices allows for high density to be achieved by constructing the arrays of data bits at very small geometries. The memory arrays include memory element layers and selector layers sandwiched between first metal layers and second metal layers, which run orthogonal the first metal layers. A single memory array may include a plurality of each of the aforementioned layers.

Because of the orthogonal orientation, memory arrays are traditionally constructed one layer at a time using a lithography step at each layer to rotate the pattern. Lithographic patterning, however, has its disadvantages. Lithography is the most costly step in a semiconductor manufacturing process, especially when those steps are for patterning the bit lines and words lines of a cross-point memory array at the finest geometry. Furthermore, each lithographic patterning step for each layer of final memory takes time and alignment of each of the layers takes additional time and may reduce overall yield.

Thus, there is a need in the art for an improved method for forming fine geometry electrical circuits, such as 3D cross-point memory arrays.

SUMMARY OF THE DISCLOSURE

The present disclosure generally relates to fine geometry electrical circuits and methods of manufacture thereof. More specifically, methods for forming 3D cross-point memory arrays using a single nano-imprint lithography step and no photolithography are disclosed. The method includes imprinting a multilevel topography pattern, transferring the multilevel topography pattern to a substrate, filling the etched multilevel topography pattern with hard mask material, planarizing the hard mask material to expose a first portion of the substrate, etching a first trench in the first portion of the substrate, depositing a first plurality of layers in the first trench, planarizing the hard mask material to expose a second portion of the substrate, etching a second trench in the second portion of the substrate and depositing a second plurality of layers in the second trench. The method is repeated until a 4F² 3D cross-point memory array has been formed.

In one embodiment, a memory device is disclosed. The memory device includes a first plurality of layers disposed in a first trench, a second plurality of layers in a second trench and a third plurality of layers in a third trench. The first plurality of layers includes a first layer of first metal material and a second layer of first metal material. The second plurality of layers includes a third layer of first metal material, a first layer of second metal material, a fourth layer of first metal material and a second layer of second metal material. The third layer of first metal material is coplanar with the first layer of first metal material in the first trench. The fourth layer of first metal material is coplanar with the second layer of first metal material in the first trench. The third plurality of layers disposed in a third trench includes a third layer of second metal material and a fourth layer of second metal material. The third layer of second metal material is coplanar with the first layer of second metal material. The fourth layer of second metal material is coplanar with the second layer of second metal material. A depth of the first trench and a depth of the second trench are equal. A depth of the third trench is less than the depth of the first trench and the depth of the second trench.

In another embodiment, a method is disclosed. The method includes planarzing a hard mask material to expose a first portion of a substrate, etching a first trench into the first portion of the substrate, depositing a first plurality of layers in the first trench, planarizing the hard mask material to expose a second portion of a substrate, etching a second trench into the second portion of the substrate and depositing a second plurality of layers in the second trench.

In another embodiment, a method is disclosed. The method includes planarzing a hard mask material to expose a first portion of a substrate, etching a first trench into the first portion of the substrate, filling the first trench with a first metal material, etching the first metal material to form a first layer of first metal material, filling the first trench with a dielectric material, etching the dielectric material, filling the first trench with the first metal material, etching the first metal material to form a second layer of first metal material, filling the first trench with the dielectric material, etching the dielectric material and filling the first trench with a first additional amount of hard mask material.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to fine geometry electrical circuits and methods of manufacture thereof. More specifically, methods for forming 3D cross-point memory arrays using a single nano-imprint lithography step and no photolithography are disclosed. The method includes imprinting a multilevel topography pattern, transferring the multilevel topography pattern to a substrate, filling the etched multilevel topography pattern with hard mask material, planarizing the hard mask material to expose a first portion of the substrate, etching a first trench in the first portion of the substrate, depositing a first plurality of layers in the first trench, planarizing the hard mask material to expose a second portion of the substrate, etching a second trench in the second portion of the substrate and depositing a second plurality of layers in the second trench. The method is repeated until a $4F^2$ 3D cross-point memory array has been formed.

Figure 1:
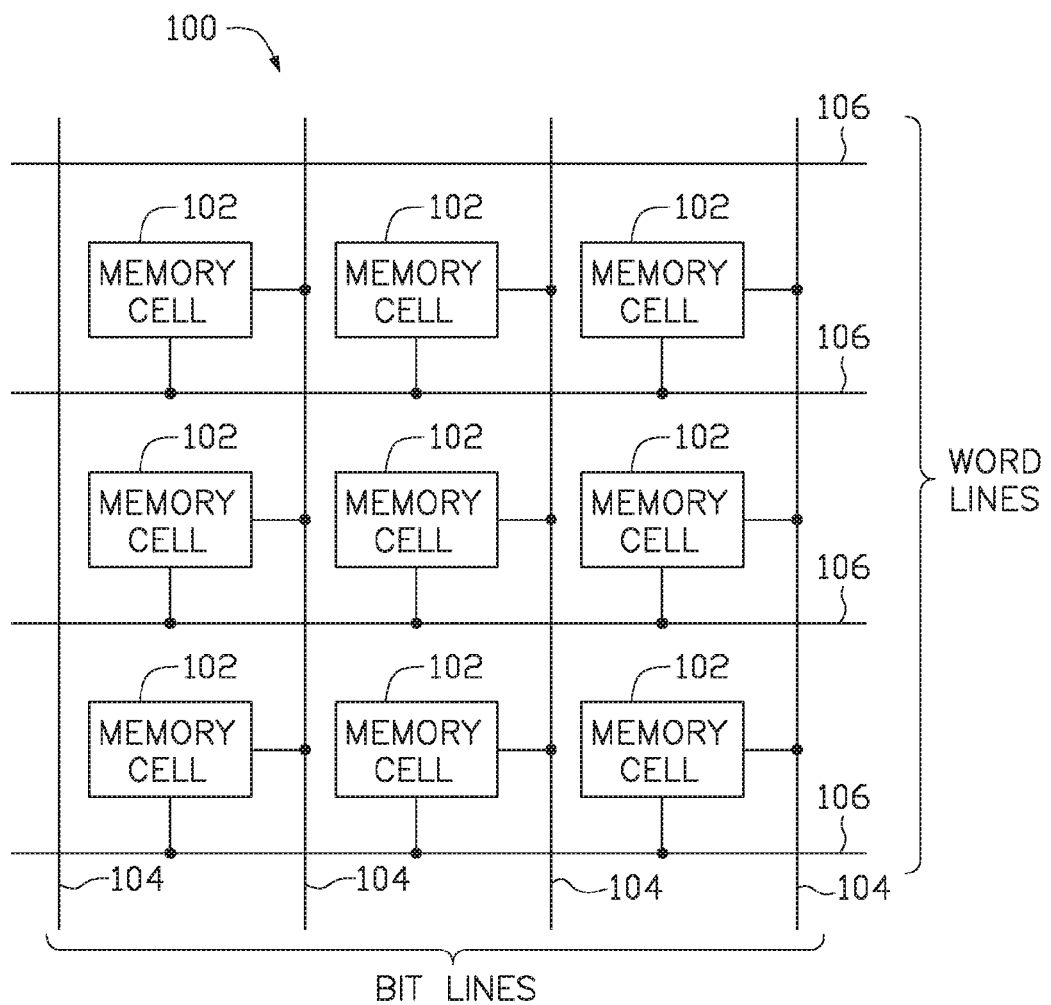
FIG. 1 is a schematic diagram of a memory array according to one embodiment described herein.

FIG. 1 is a schematic diagram of a memory array 100 according to one embodiment described herein. The memory array 100 includes a plurality of memory cells 102, a first plurality of parallel lines 104 and a second plurality of parallel lines 106. The first plurality of parallel lines 104 runs orthogonal to the second plurality of parallel lines 106. The first plurality of parallel lines 104 may represent bit lines and the second plurality of parallel lines 106 may represent word lines. Each memory cell 102 is coupled to a bit line 104 and a word line 106. Co-linear memory cells 102 are coupled to one common line and one line not in common with the other co-linear memory cells 102.

Figure 2:
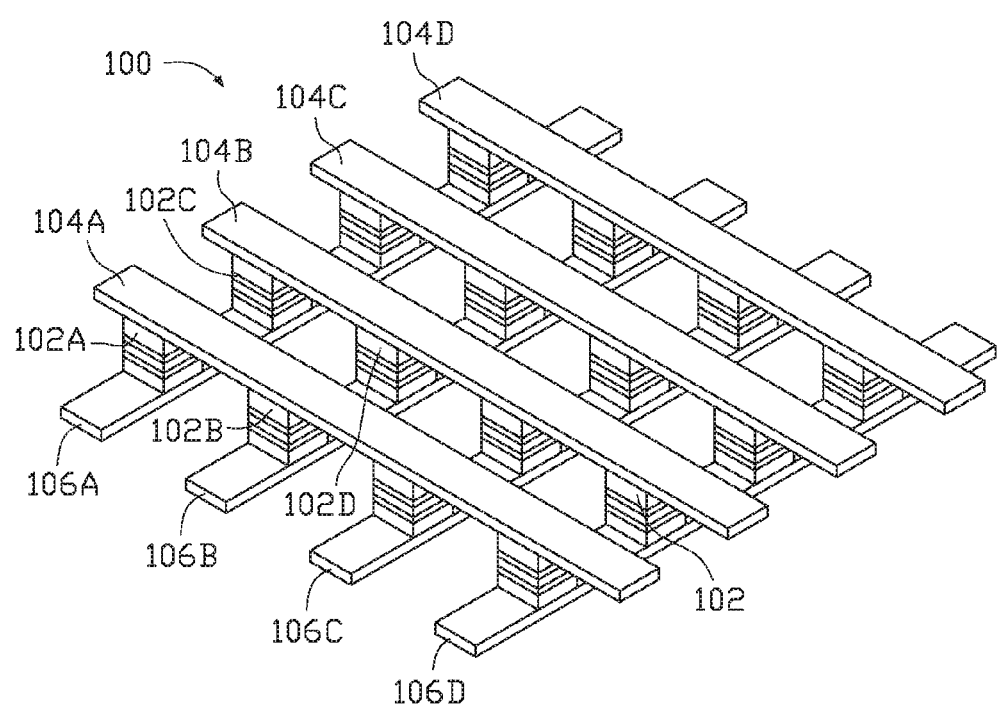
FIG. 2 is a schematic perspective view of the memory array according to one embodiment described herein.

FIG. 2 is a schematic perspective view of the above described memory array 100 according to one embodiment described herein. The first plurality of parallel lines 104 is disposed in a common plane. The second plurality of parallel lines 106 is disposed in a common plane spaced above the first plurality of parallel lines 104. The memory array 100 is arranged such that a first memory cell 102A is coupled to a first line 104A of the first plurality of parallel lines 104. The first memory cell 102A is also coupled to a first line 106A of the second plurality of parallel lines 106. A second memory cell 102B is coupled to the first line 104A and a second line 106B of the second plurality of parallel lines 106. A third memory cell 102C is coupled to a second line 104B of the first plurality of parallel lines 104. The third memory cell 102C is also coupled to the first line 106A. A fourth memory cell 102D is coupled to both the second line 104B and second line 106B. It is to be understood that while four lines 104A-104D of the first plurality of parallel lines 104 are shown, more or less lines may be present. Additionally, it is also to be understood that while four lines 106A-106D are shown of the second plurality of parallel lines 106, more or less lines may be present.

While $4F^2$ is a typical limit for cross-point memories, it is contemplated that the memory cell footprint may also be larger or smaller than $4F^2$ in certain embodiments of the present disclosure. In some embodiments, the space between the memory cells may be smaller than 1F, thus less than $4F^2$. In other embodiments, for example, in most MRAM devices, the space between the memory cells may be larger than $12F^2$, and thus greater than $4F^2$. If the memory cell stores two or more bits per cell, the area is generally divided by the number of bits in order to calculate the effective footprint of a memory cell. As such, each memory cell of the present disclosure may have a sub-lithographic footprint (i.e., a footprint smaller than less than $4F^2$), a $4F^2$ footprint, or a footprint greater than $4F^2$. The amount of logic located at each memory cell may be located to enable the formation of the defined pulse while fitting within a footprint of greater than, less than, or equal to $4F^2$.

Figure 3:
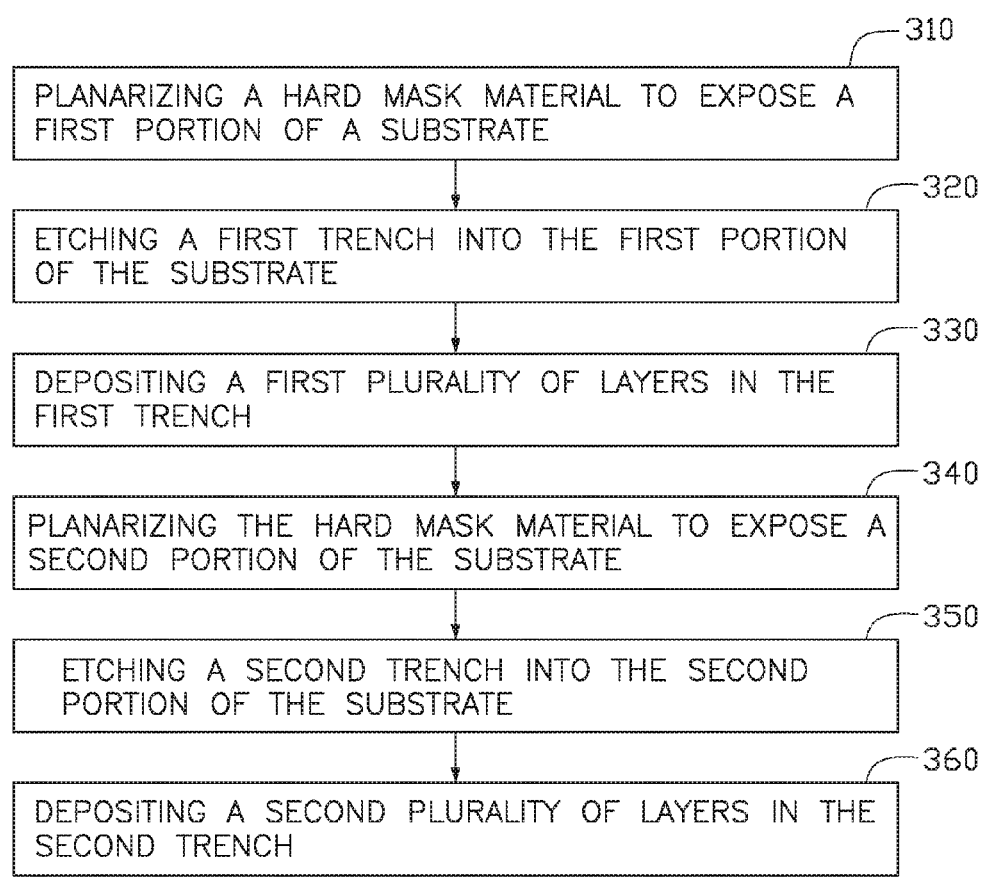
FIG. 3 illustrates operations of a method for forming a 3D cross-point memory array according to embodiments described herein.
Figure 4A:
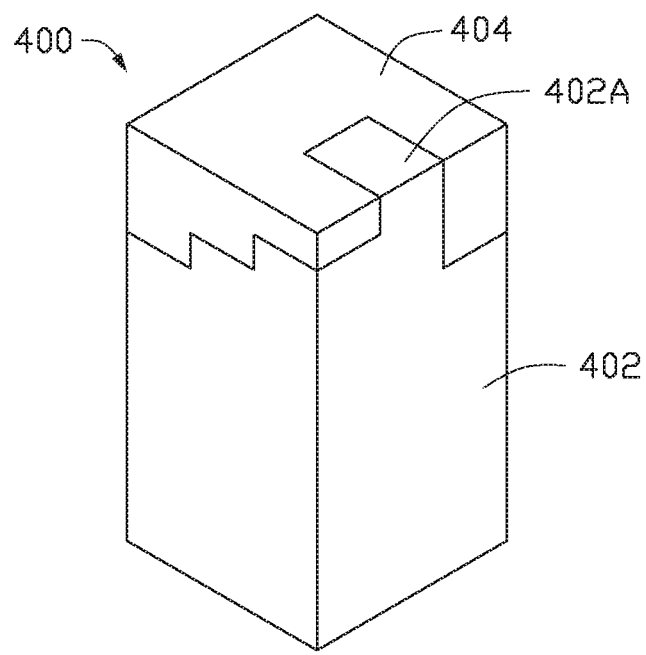
FIGS. 4A-4Y depict a 3D cross-point memory array at various stages of the methods described herein.
Figure 4B:
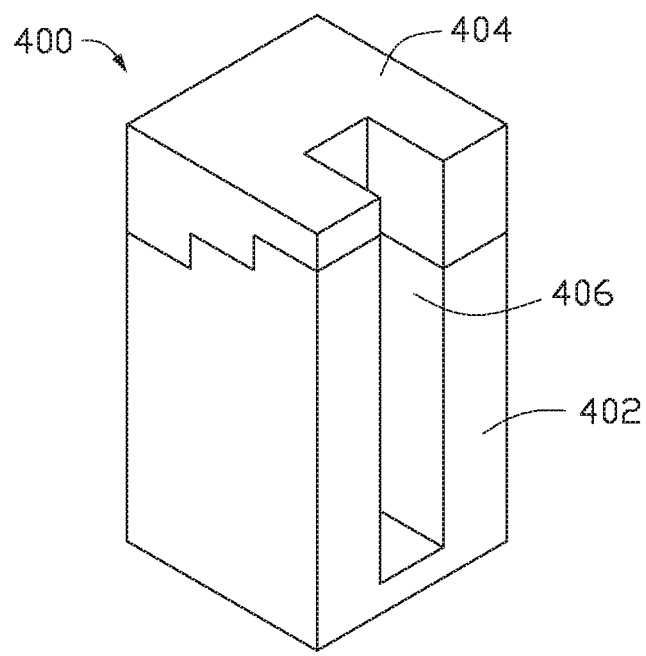
Figure 4C:
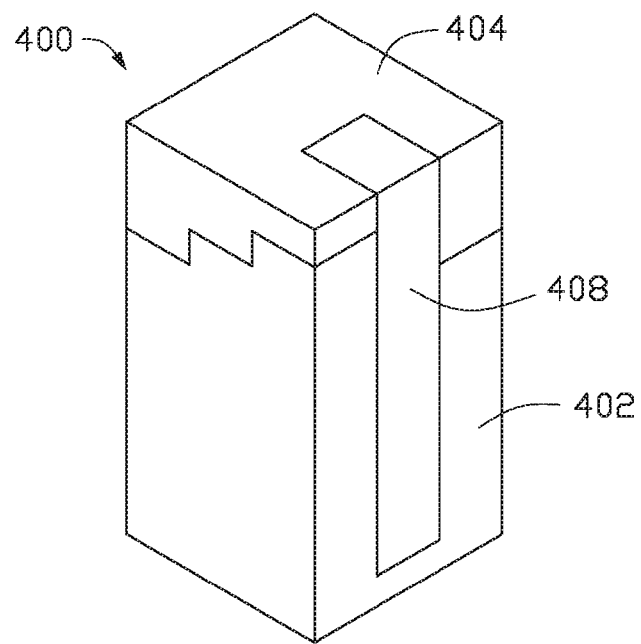
Figure 4D:
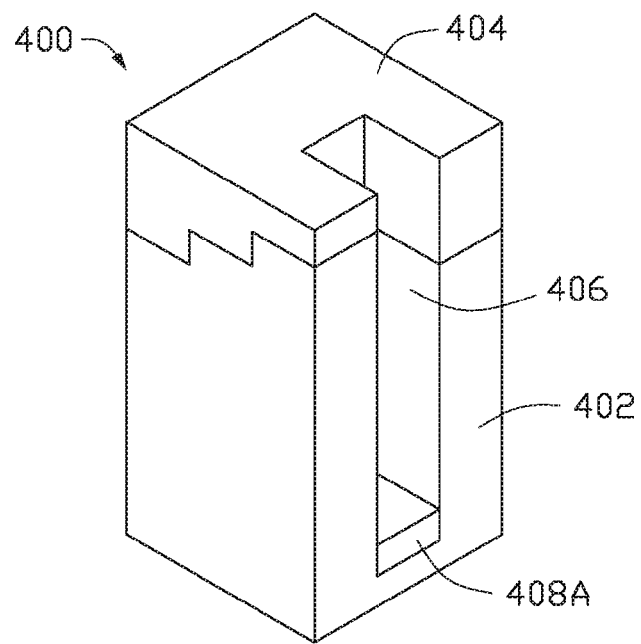
Figure 4E:
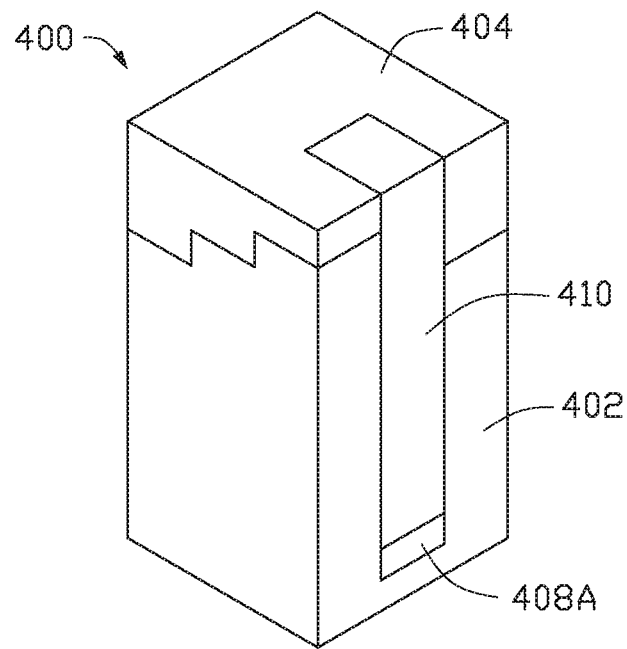
Figure 4F:
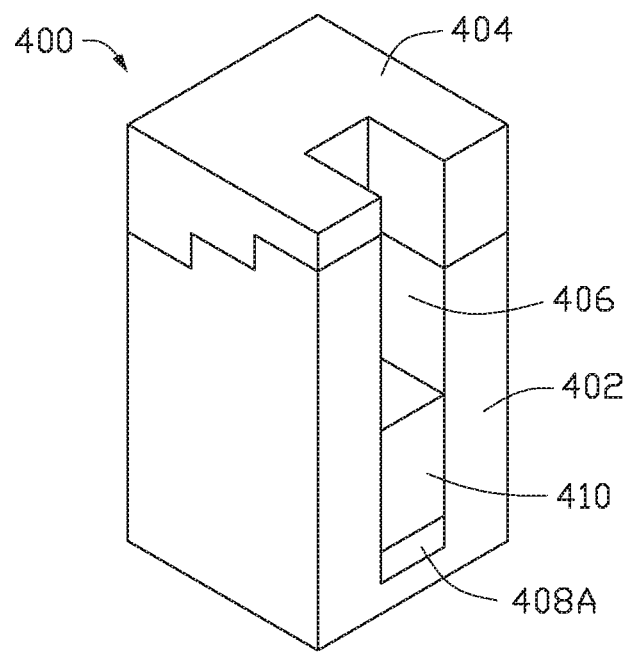

FIG. 3 illustrates operations of a method 300 for forming a 3D cross-point memory array according to embodiments described herein. FIGS. 4A-4Y depict a 3D cross-point memory array 400 at various stages of the methods described herein. Prior to operation 310, the method begins with the imprinting of a multilevel topography pattern. The multilevel topography pattern is then transferred to the substrate 402. The pattern may be transferred using any suitable etching process. The multilevel topography pattern etched into the substrate 402 is then filled with a hard mask material 404. Filling the multilevel topography pattern may be accomplished by physical vapor deposition (PVD), chemical vapor deposition (CVD) or any other suitable deposition process. The substrate 402 may be an oxide material or any other suitable substrate material. The hard mask material 404 may be any suitable hard mask material.

At operation 310, the hard mask material 404 is planarized to expose a first portion 402A of the substrate 402, as shown in FIG. 4A. As a result of the patterning of the multilevel topography pattern into the substrate 402, the first portion 402A has a first height. The planarization may be performed by chemical mechanical planarization (CMP), which is a polishing process utilizing chemical and mechanical forces for surface smoothing. By planarizing the hard mask material 404 to expose the first portion 402A, the hard mask material 404 protects all of the substrate 402 except for the exposed first portion 402A. At operation 320, a first trench 406 is etched into the first portion 402A of the substrate 402, as shown in FIG. 4B. The first trench 406 is not etched all the way through the first portion 402A of the substrate 402. In other words a portion of the substrate 402 remains at the bottom of the first trench 406. In one example, etching the first trench 406 may be accomplished using a reactive ion etch (RIE). Alternatively, etching the first trench 406 may be accomplished by placing an etch stop barrier at the desired depth of the first trench 406 or by using a timed etch to etch the first trench 406 down to the desired depth.

At operation 330, a first plurality of layers is deposited in the first trench 406. More specifically, the first trench 406 is filled with a first metal material 408, as shown in FIG. 4C. The first metal material 408 may be physical vapor deposition (PVD) Tungsten or any other suitable metal material. The first metal material 408 is then etched back down to form a first layer 408A of first metal material 408 at the bottom of the first trench 406, as shown in FIG. 4D. The etching of the first metal material 408 may be a timed etch or any other suitable etch process. Next, the first trench 406 is filled with a dielectric material 410, as shown in FIG. 4E.

The dielectric material 410 may be an oxide dielectric material or any suitable dielectric material. The dielectric material 410 is then etched back down to a desired depth in the first trench 406, as shown in FIG. 4F. The etching of the dielectric material 410 may be a timed etch or any other suitable etch process.

Figure 4G:
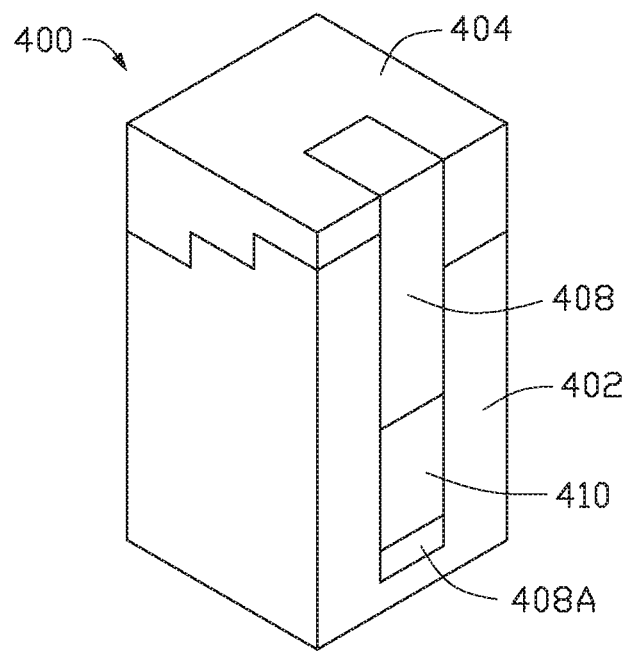
Figure 4H:
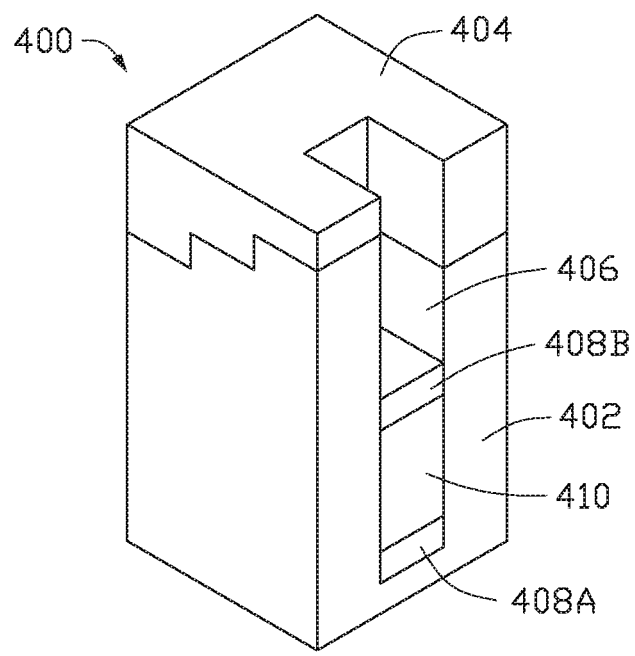
Figure 4I:
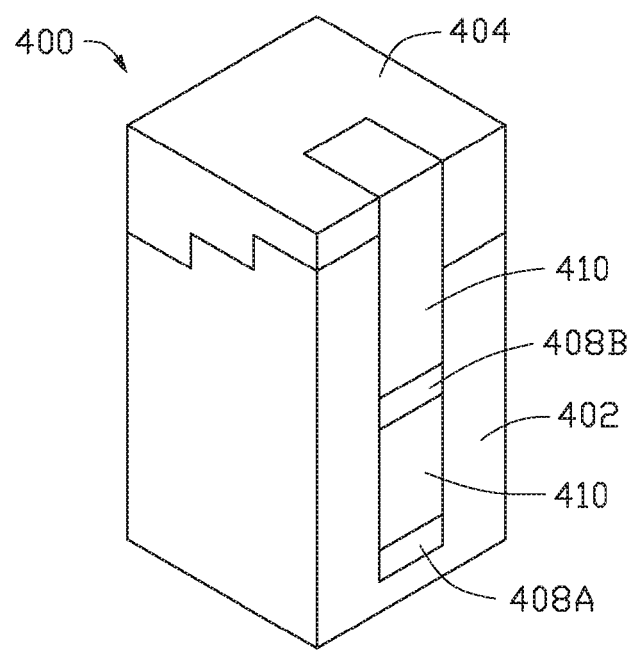
Figure 4J:
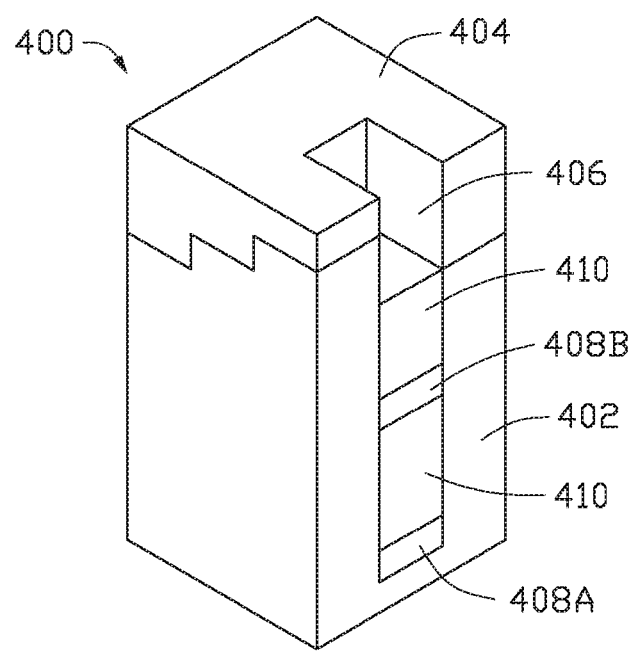
Figure 4K:
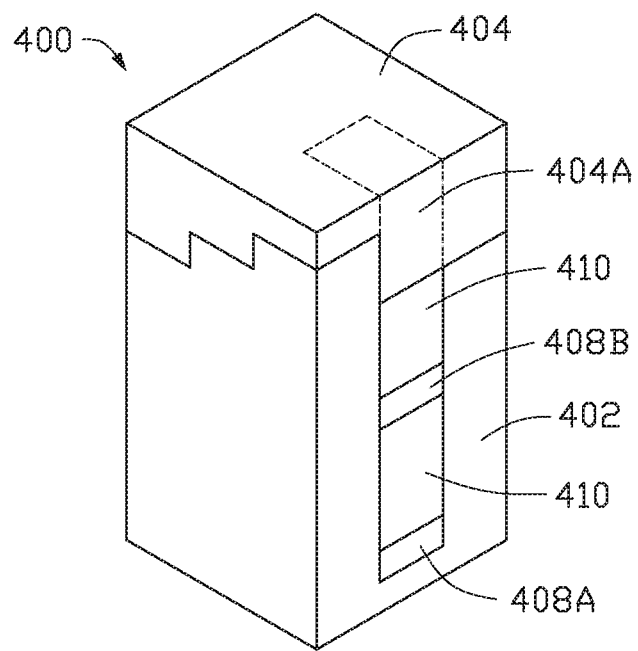

Next, the first trench 406 is again filled with the first metal material 408, as shown in FIG. 4G. The first metal material 408 is then etched back down to form a second layer 408B of the first metal material 408 in the first trench 406, as shown in FIG. 4H. The etching of the first metal material 408 may be a timed etch or any other suitable etch process. The first trench 406 is re-filled with the dielectric material 410, as shown in FIG. 4I. The dielectric material 410 is then etched back down to a desired depth in the first trench 406, as shown in FIG. 4J. The etching of the dielectric material 410 may be a timed etch or any other suitable etch process. The first trench 406 is then filled a first additional amount of hard mask material 404A, as shown in FIG. 4K.

While the paragraphs above describe deposition of a first layer 408A of first metal material 408 and a second layer 408B of first metal material 408, the above described operations may be repeated to deposit additional layers of the first metal material 408 in the first trench 406. For example, the operations may be repeated to deposit two additional layers of the first metal material 408 in the first trench 406 such that a $4F^2$ 3D cross-point memory array may be formed.

Figure 4L:
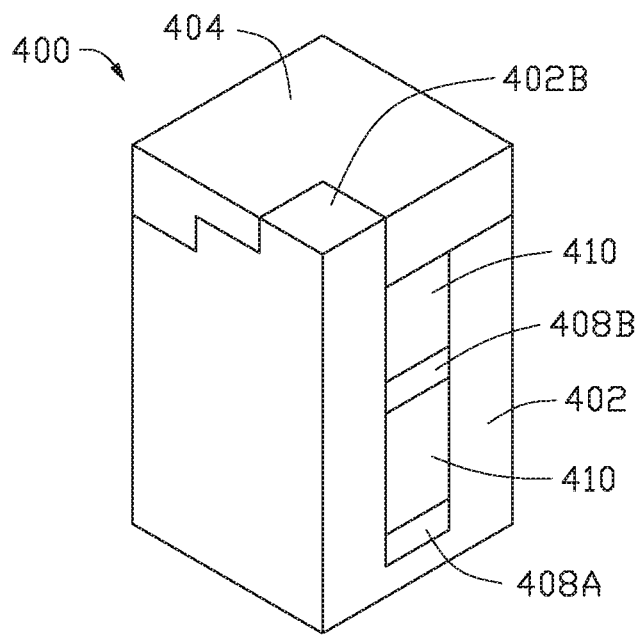
Figure 4M:
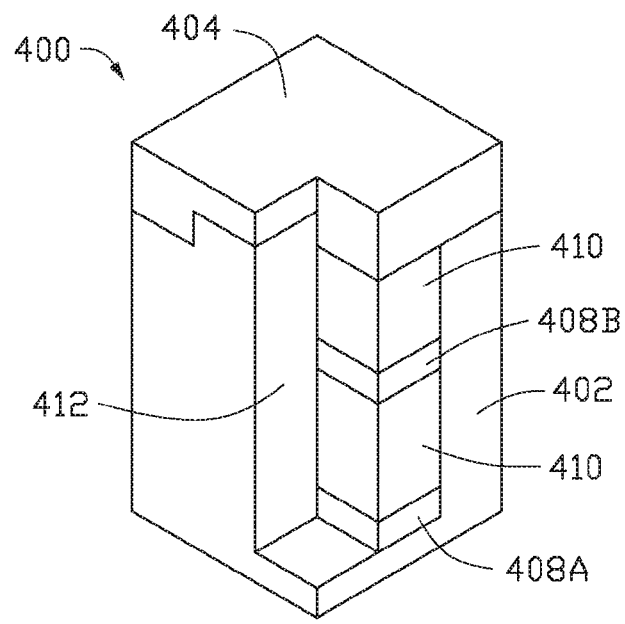

At operation 340, the hard mask material 404 is planarized to expose a second portion 402B of the substrate 402, as shown in FIG. 4L. The exposed section portion 402B of the substrate 402 is self-aligned to the first portion 402A of the substrate 402. The section portion 402B has a second height that is less than the first height of the first portion 402A. The planarization may be performed by CMP planarization. By planarizing the hard mask material 404 to expose the second portion 402B, the hard mask material 404 protects all of the substrate 402 except for the exposed second portion 402B. At operation 350, a second trench 412 is etched into the second portion 402B of the substrate 402, as shown in FIG. 4M. The second trench 412 is etched down such that the bottom of the second trench 412 is coplanar with the bottom of the first trench 406 and a portion of the substrate 402 remains at the bottom of the second trench 412. In example, etching the second trench 412 may be accomplished using an RIE etch. Alternatively, etching the second trench 412 may be accomplished by placing an etch stop barrier at the desired depth of the second trench 412 or by using a timed etch to etch the second trench 412 down to the desired depth.

Figure 4N:
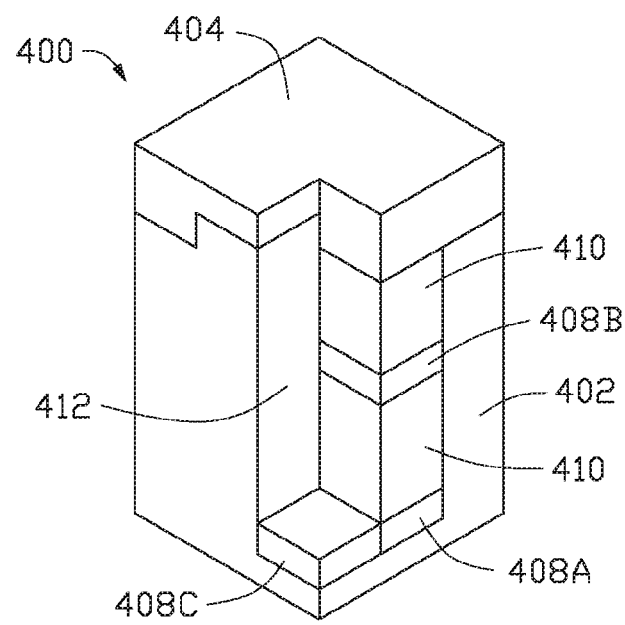

At operation 360, a second plurality of layers is deposited in the second trench 412. The second trench 412 is first filled with the first metal material 408. The first metal material 408 is then etched back down such that a third layer 408C of first metal material 408 is formed coplanar with the first layer 408A of first metal material 408, as shown in FIG. 4N. The third layer 408C and the first layer 408A are disposed coplanar to one another such that they connect and begin to form either a word line or a bit line of a $4F^2$ 3D cross-point memory array.

Figure 4O:
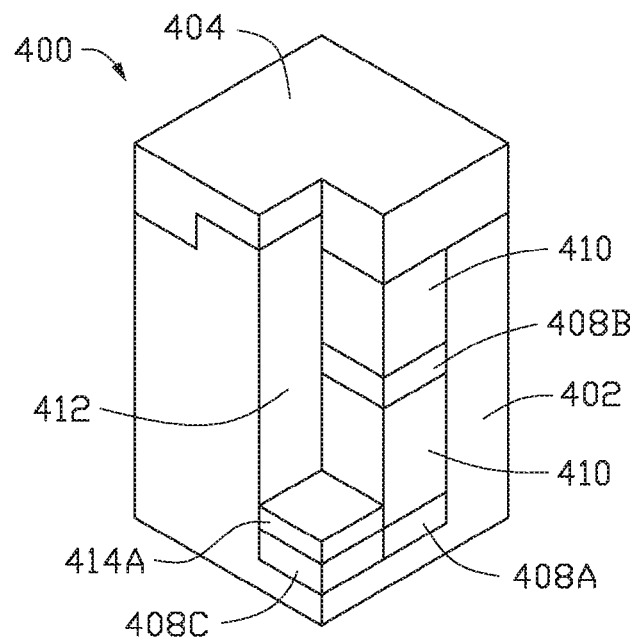

The second trench 412 is then filled with a memory cell information storage material 414. The memory cell information storage material 414 may be a resistive random access memory (RAM) material, a phase change material or any other suitable memory cell information storage material. The memory cell information storage material 414 is then etched back down to a desired depth and a first layer 414A of memory cell information storage material 414 is disposed over the third layer 408C of first metal material 408, as shown in FIG. 4O. In one example, the first layer 414A of memory cell information storage material 414 is disposed on and in contact with the third layer 408C of the first metal material 408. The etching of the memory cell information storage material 414 may be a timed etch or any other suitable etching process.

Figure 4P:
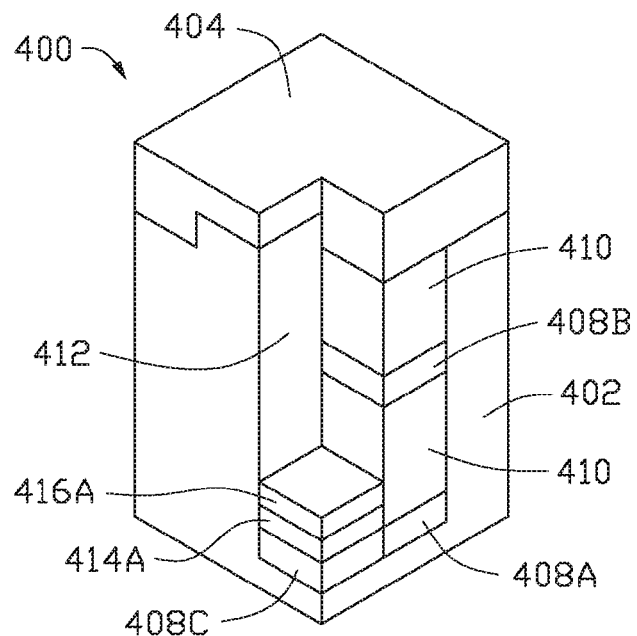

Next, the second trench 412 is filled with an ovonic threshold switching (OTS) material 416. The OTS material 416 is then etched back down to a desired depth and a first layer 416A of OTS material 416 is disposed over the first layer 414A of memory cell information storage material 414, as shown in FIG. 4P. In one example, the first layer 416A of OTS material 416 is disposed on and in contact with the first layer 414A of the memory cell information storage material 414. The etching of the OTS material 416 may be a timed etch or any other suitable etching process.

Figure 4Q:
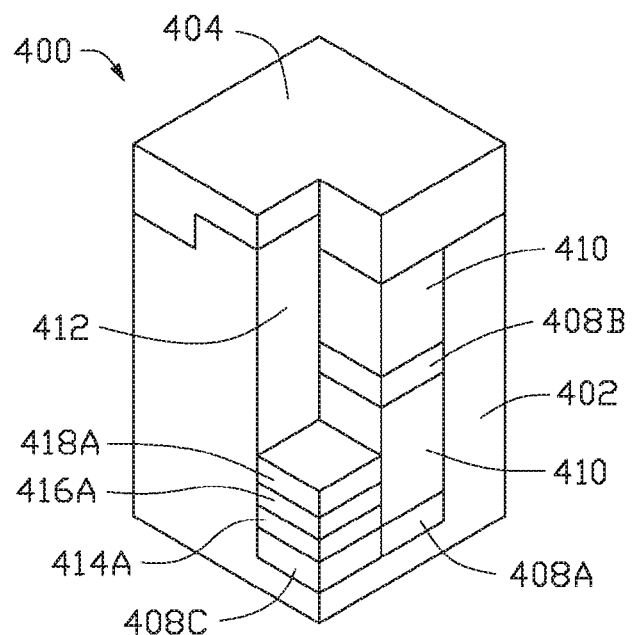

The second trench 412 is then filled with a second metal material 418. The second metal material 418 may be Titanium Nitride or any other suitable metal material. The second metal material 418 is then etched back down to form a first layer 418A of second metal material 418 over the first layer 416A of OTS material 416, as shown in FIG. 4Q. The etching of the second metal material 418 may be a timed etch or any other suitable etch process.

Figure 4R:
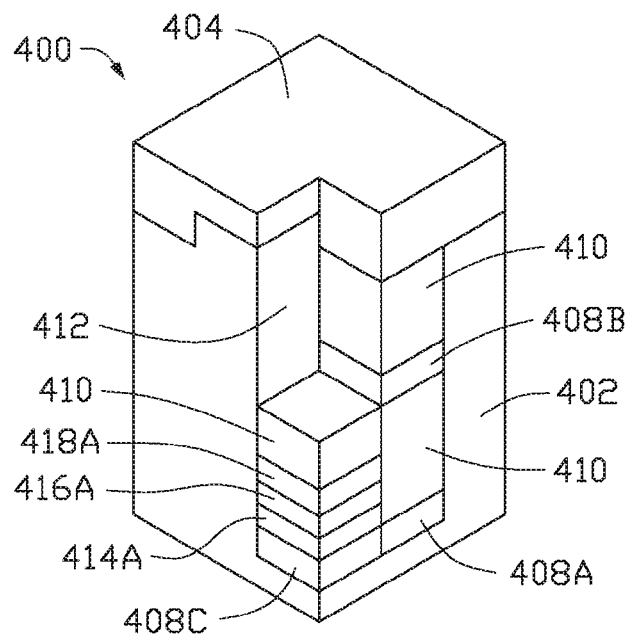

The second trench 412 is then filled with the dielectric material 410. The dielectric material 410 is then etched back down to a desired depth in the second trench 412, as shown in FIG. 4R. The etching of the dielectric material 410 may be a timed etch or any other suitable etch process.

Figure 4S:
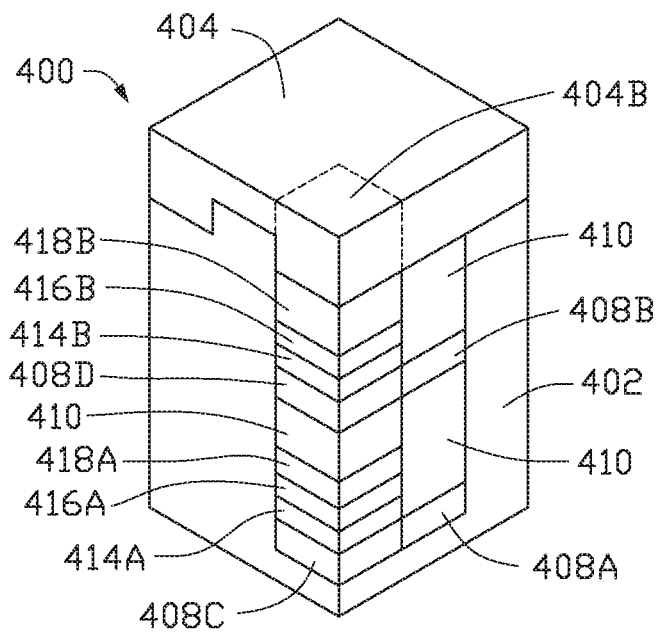

The aforementioned operations are repeated to form additional layers in the second trench, including a fourth layer 408D of first metal material 408, a second layer 414B of memory cell information storage material 414, a second layer 416B of OTS material 416, and a second layer 418B of second metal material 418, as shown in FIG. 4S. In one example, the fourth layer 408D of the first metal material 408 is disposed over the dielectric material 410, the second layer 414B of memory cell information storage material 414 is disposed over the fourth layer 408D of the first metal material 408, the second layer 416B of OTS material 416 is disposed over the second layer 414B of memory cell information storage material 414, and the second layer 418B of second metal material 418 is disposed over the second layer 416B of OTS material 416. In a further example, the fourth layer 408D of the first metal material 408 is disposed on and in contact with the dielectric material 410, the second layer 414B of memory cell information storage material 414 is disposed on and in contact with the fourth layer 408D of the first metal material 408, the second layer 416B of OTS material 416 is disposed on and in contact with the second layer 414B of memory cell information storage material 414, and the second layer 418B of second metal material 418 is disposed on and in contact with the second layer 416B of OTS material 416. The aforementioned operations may be repeated such that a $4F^2$ 3D cross-point memory array may be formed.

Figure 4T:
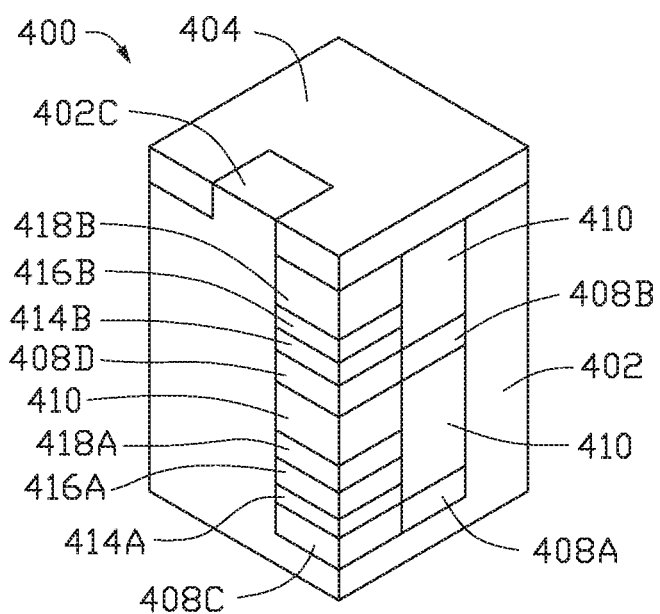
Figure 4U:
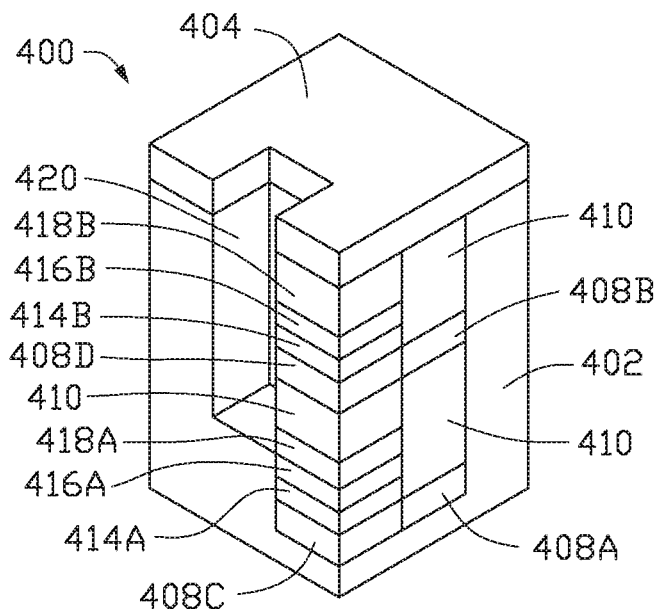

After the second plurality of layers has been formed in the second trench 412, a second additional amount of hard mask material 404B is deposited in the second trench 412. The hard mask material 404 is then planarized to expose a third portion 402C of the substrate 402, as shown in FIG. 4T. The exposed third portion 402C of the substrate 402 is self-aligned to the second portion 402B of the substrate 402. The third portion 402C has a third height that is less than the second height of the second portion 402B and the first height of the first portion 402A. The planarization may be performed by CMP planarization. By planarizing the hard mask material 404 to expose the third portion 402C, the hard mask material 404 protects all of the substrate 402 except for the exposed third portion 402C. A third trench 420 is etched into the third portion 402C of the substrate 402, as shown in FIG. 4U. The third trench 420 is etched down such that the bottom of the third trench 420 is coplanar with the bottom of the first layer 418A of second metal material 418. In one example, etching the third trench 420 may be accomplished using an RIE etch. Alternatively, etching the third trench 420 may be accomplished by placing an etch stop barrier at the desired depth of the third trench 420 or by using a timed etch to etch the third trench 420 down to the desired depth.

Figure 4V:
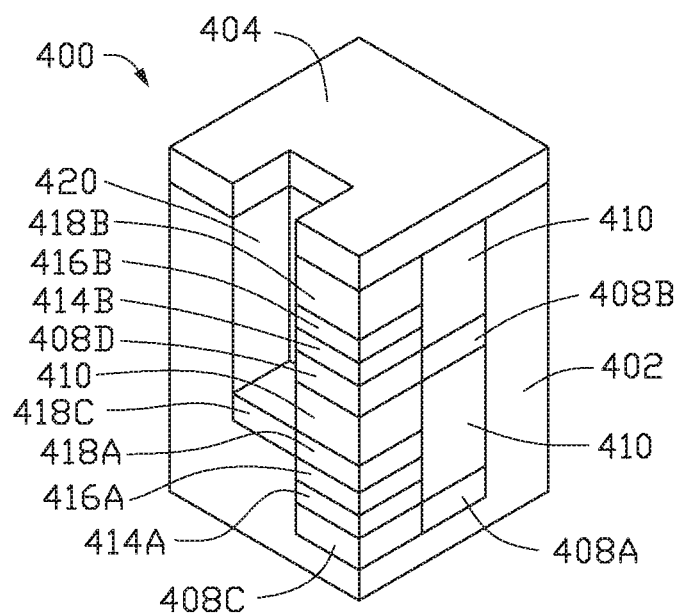

Next, the third trench 420 is filled with a third plurality of layers. The third trench 420 is first filled with second metal material 418. The second metal material 418 is then etched back down such that a third layer 418C of second metal material 418 is formed at the bottom of the third trench 420 and coplanar with the first layer 418A of second metal material 418, as shown in FIG. 4V. The third layer 418C and the first layer 418A are disposed coplanar to one another such that they connect and begin to form either a word line or a bit line of a $4F^2$ 3D cross-point memory array. The etching of the second metal material 418 may be a timed etch or any other suitable etch process.

Figure 4W:
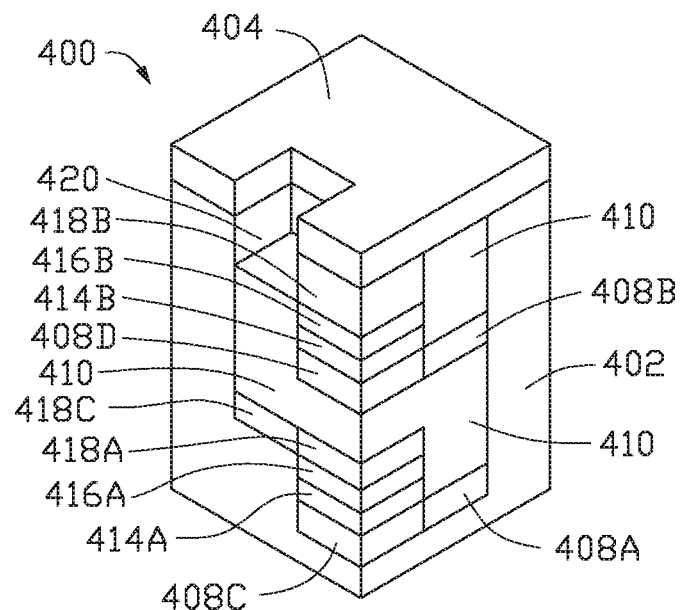

Next, the third trench 420 is filled with dielectric material 410. The dielectric material 410 is then etched back down such that the top surface of the dielectric material 410 in the third trench 420 is coplanar with the bottom surface of the second layer 418B of second metal material 418 in the second trench 412, as shown in FIG. 4W. The etching of the dielectric material 410 may be a timed etch or any other suitable etch process.

Figure 4X:
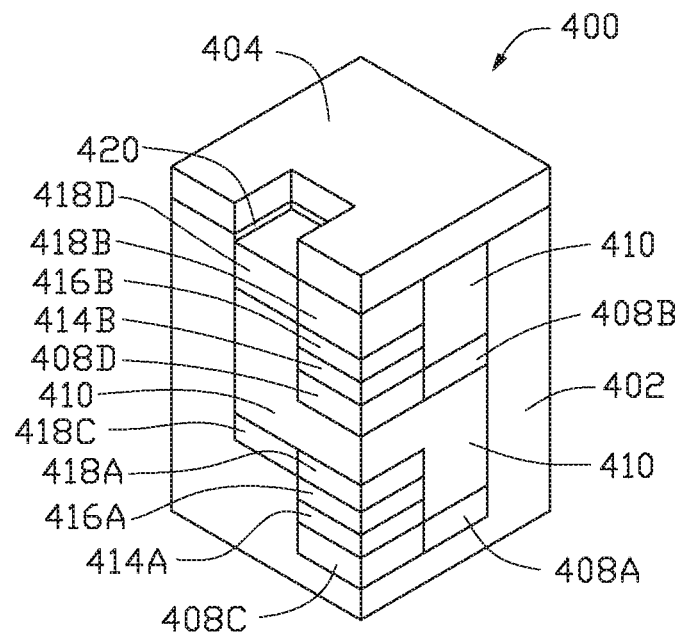
Figure 4Y:
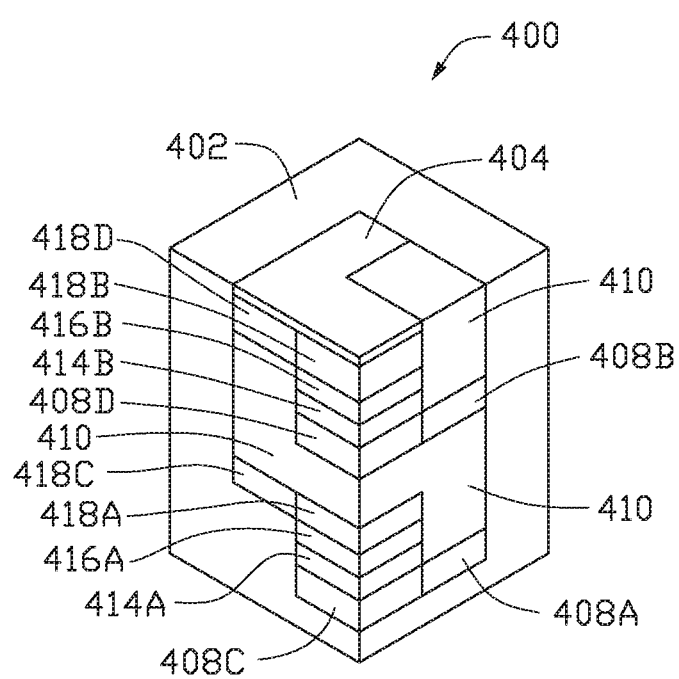

Then, the third trench 420 is again filled with the second metal material 418. The second metal material 418 is then etched back down such that a fourth layer 418D of second metal material 418 is formed coplanar with the second layer 418B of second metal material 418, as shown in FIG. 4X. The fourth layer 418D and the second layer 418B are disposed coplanar to one another such that they connect and begin to form another word line or bit line of a $4F^2$ 3D cross-point memory array. The etching of the second metal material 418 may be a timed etch or any other suitable etch process.

The above described operations result in a memory device, as shown in FIG. 4Y. The memory device includes a first plurality of layers disposed in the first trench 406, a second plurality of layers disposed in the second trench 412 and a third plurality of layers disposed in the third trench 420. The depths of the first trench 406 and the second trench 412 are equal. The depth of the third trench 420 is less than the depth of the first trench 406 and the second trench 412. More specifically, the bottom of the first trench is coplanar with the top surface of the first layer 416A of OTS material 416. The first plurality of layers disposed in the first trench 406 includes the first layer 408A of first metal material 408, a layer of dielectric material 410 over the first layer 408A of first metal material 408, and the second layer 408B of first metal material 408 sandwiched between layers of dielectric material 410.

The second plurality of layers disposed in the second trench 412 includes the third layer 408C of first metal material, the first layer 414A of memory cell information storage material 414, the first layer 416A of OTS material 416, the first layer 418A of second metal material 418, a layer of dielectric material 410, the fourth layer 408D of first metal material 408, the second layer 414B of memory cell information storage material 414, the second layer 416B of OTS material 416, and the second layer 418B of second metal material 418. The third layer 408C of first metal material 408 is coplanar with the first layer 408A of first metal material 408 in the first trench 406. The fourth layer 408D of first metal material 408 is coplanar with the second layer 408B of first metal material 408 in the first trench 406.

The third plurality of layers disposed in the third trench 420 includes the third layer 418C of second metal material 418, a layer of dielectric material 410, and the fourth layer 418D of second metal material 418. The third layer 418C of second metal material 418 is coplanar with the first layer 418A of second metal material 418 in the second trench 412. The fourth layer 418D of second metal material 418 is coplanar with the second layer 418B of second metal material 418 in the second trench 412.

The above described operations may be repeated to deposit additional layers in additional trenches which may be formed in the remaining exposed areas of the substrate 402, which correspond to cross-points at which memory cells, word lines, or bit lines need to be formed as part of a $4F^2$ 3D cross-point memory array. In other words, the above described building sequence may be repeated for each depth of the originally imprinted multilevel topography pattern. Each of the resulting plurality of layer stacks connects to their adjacent stacks to form the fine geometry electrical circuit.

Benefits of the present disclosure include manufacturing a 3D cross-point memory array using only a single nano-imprint lithography patterning step and no photolithography steps. These methods result in cost-efficient and time-efficient production of memory devices having very fine geometries.

In summation, the present disclosure generally relates to fine geometry electrical circuits and methods of manufacture thereof. More specifically, methods for forming 3D cross-point memory arrays using a single nano-imprint lithography step and no photolithography are disclosed. The method includes imprinting a multilevel topography pattern, transferring the multilevel topography pattern to a substrate, filling the etched multilevel topography pattern with hard mask material, planarizing the hard mask material to expose a first portion of the substrate, etching a first trench in the first portion of the substrate, depositing a first plurality of layers in the first trench, planarizing the hard mask material to expose a second portion of the substrate, etching a second trench in the second portion of the substrate and depositing a second plurality of layers in the second trench. The method is repeated until a $4F^2$ 3D cross-point memory array has been formed.

While the foregoing is directed to embodiments of the present disclosure, other and further embodiments of the disclosure may be devised without departing from the basic scope thereof, and the scope thereof is determined by the claims that follow.

What is claimed is:

1. A memory device, comprising:
a first plurality of layers disposed in a first trench;
a second plurality of layers disposed in a second trench; and
a third plurality of layers disposed in a third trench, wherein a depth of the first trench and a depth of the second trench are equal, and wherein a depth of the third trench is less than the depth of the first trench;
wherein the first plurality of layers comprises:
a first layer of first metal material; and a second layer of the first metal material,
wherein the second plurality of layers comprises:
   a third layer of the first metal material, wherein the third layer of the first metal material is coplanar with the first layer of the first metal material in the first trench;
   a first layer of second metal material;
   a fourth layer of the first metal material, wherein the fourth layer of the first metal material is coplanar with the second layer of the first metal material in the first trench; and
   a second layer of the second metal material; and
wherein the third plurality of layers comprises:
   a third layer of the second metal material, wherein the third layer of the second metal material is coplanar with the first layer of the second metal material; and
   a fourth layer of the second metal material, wherein the fourth layer of the second metal material is coplanar with the second layer of the second metal material, wherein a depth of the first trench and a depth of the second trench are equal, and wherein a depth of the third trench is less than the depth of the first trench and the depth of the second trench.

2. The memory device of claim 1, wherein the first metal material comprises tungsten and wherein the second metal material comprises titanium nitride.

3. The memory device according to claim 1, wherein the memory cell has a footprint of $4F^2$ where F is a minimum feature size.

4. The memory device according to claim 1, wherein the memory cell has a footprint greater than $4F^2$ where F is a minimum feature size.

5. The memory device according to claim 1, wherein the memory cell has a footprint less than $4F^2$ where F is a minimum feature size.

6. The memory device according to claim 1, wherein at least a layer in the plurality of layers in the second trench has information storage material.

7. The memory device according to claim 6, wherein the information storage material is a resistive random access memory material.

8. The memory device according to claim 6, wherein the information storage material is a phase change material.

9. A memory device, comprising:
   a first plurality of layers disposed in a first trench, wherein the first plurality of layers comprises:
      a first layer of dielectric material; and
      a second layer of the dielectric material;
   a second plurality of layers disposed in a second trench, wherein the second plurality of layers comprises:
      a third layer of the dielectric material, wherein the third layer of the dielectric material is partially coplanar with the second layer of the dielectric material; and
   a third plurality of layers disposed in a third trench, wherein the third plurality of layers comprises:
      a fourth layer of the dielectric material, wherein the third layer of the dielectric material is partially coplanar with the fourth layer of the dielectric material, wherein the first layer of the dielectric material is disposed above third layer of the dielectric material, and wherein a depth of the first trench and a depth of the second trench are equal, and wherein a depth of the third trench is less than the depth of the first trench and the depth of the second trench.

10. The memory device of claim 9, wherein the first plurality of layers disposed in the first trench further comprising:
   a first layer of first metal material; and
   a second layer of the first metal material, wherein the first layer of the dielectric material is disposed between the first layer of the first metal material and the second layer of the first metal material.

11. The memory device of claim 10, wherein the first metal material comprises tungsten.

12. The memory device of claim 9, wherein the second plurality of layers disposed in the second trench further comprises:
   a first memory device; and
   a second memory device, wherein the third layer of the dielectric material is disposed between the first memory device and the second memory device.

13. The memory device of claim 9, wherein the second plurality of layers disposed in the second trench further comprises:
   a first layer of second metal material; and
   a second layer of the second metal material, wherein the third layer of the dielectric material is disposed between the first layer of the second metal material and the second layer of the second metal material.

14. The memory device of claim 13, wherein the third plurality of layers disposed in the third trench further comprises:
   a third layer of the second metal material, wherein the third layer of the second metal material is coplanar with the first layer of the second metal material; and
   a fourth layer of the second metal material, wherein the fourth layer of the second metal material is coplanar with the second layer of the second metal material.

15. The memory device of claim 13, wherein the fourth layer of the dielectric material is disposed between the third layer of the second material and the fourth layer of the second metal material.

16. The memory device of claim 13, wherein the second metal material comprises titanium nitride.

17. A memory device, comprising:
   a first means for electrical contact;
   a second means for electrical contact;
   a first means for electrical insulation;
   a second means for electrical insulation, wherein the first means for electrical contact, the second means for electrical contact, the first means for electrical insulation, and the second means for electrical insulation are disposed in a first trench;
   a third means for electrical contact, wherein the third means for electrical contact is coplanar with the first means for electrical contact;
   a fourth means for electrical contact;
   a fifth means for electrical contact, wherein the fifth means for electrical contact is coplanar with the second means for electrical contact;
   a sixth means for electrical contact;
   a third means for electrical insulation, wherein the third means for electrical insulation is partially coplanar with the second means for electrical insulation, wherein the third means for electrical contact, the fourth means for electrical contact, the fifth means for electrical contact, the sixth means for electrical contact and the third means for electrical insulation are disposed in a second trench;
   a seventh means for electrical contact, wherein the seventh means for electrical contact is coplanar with the fourth means for electrical contact;
   an eighth means for electrical contact, wherein the eighth means for electrical contact is coplanar with the sixth means for electrical contact; and a fourth means for electrical insulation, wherein the third means for electrical insulation is partially coplanar with the fourth means for electrical insulation, wherein the seventh means for electrical contact, the eighth means for electrical contact and the fourth means for electrical insulation are disposed in a third trench, wherein the first means for electrical insulation is disposed above third means for electrical insulation, and wherein a depth of the first trench and a depth of the second trench are equal.

18. The memory device of claim 17, wherein the first means for electrical insulation is disposed between the first means for electrical contact and the second means for electrical contact.

19. The memory device of claim 17, wherein the third means for electrical insulation is disposed between the fourth means for electrical contact and the sixth means for electrical contact.

20. The memory device of claim 17, wherein a depth of the third trench is less than the depth of the first trench and the depth of the second trench.

21. The memory device of claim 17, wherein the fourth means for electrical insulation is disposed between the seventh means for electrical contact and the eighth means for electrical contact.

22. The memory device of claim 17, wherein a first memory device and a second memory device are disposed in the second trench, wherein the third means for electrical insulation is disposed between the first memory device and second memory device.

* * * * *